US006576921B2

(12) United States Patent
Lowrey

(10) Patent No.: US 6,576,921 B2
(45) Date of Patent: Jun. 10, 2003

(54) ISOLATING PHASE CHANGE MATERIAL MEMORY CELLS

(75) Inventor: Tyler Lowrey, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 10/005,767

(22) Filed: Nov. 8, 2001

(65) Prior Publication Data

US 2003/0086291 A1 May 8, 2003

(51) Int. Cl.[7] ............................................. H01L 29/18
(52) U.S. Cl. ..................... 257/42; 257/29.087; 438/102
(58) Field of Search .............................. 257/42, 29.087; 438/102

(56) References Cited

U.S. PATENT DOCUMENTS 5,949,088 A * 9/1999 Morgan ........................ 257/5
5,978,258 A * 11/1999 Manning .................... 365/175

OTHER PUBLICATIONS

Tyson, et al., Nonvolatile, high density, high performance phase–change memory, *IEEE Aerospace Conf. Proc.*, 5 (Mar. 2000) 385.*
Gill et al., Ovonic unified memory—a high–performance nonvolatile memory technology for stand–alone memory and embedded applications, *Dig. Tech. Papers IEEE Intern. Solid–State Circuits Conf.*, 1 (Feb. 2000) 202.*
Maimon et al., Chalcogenide–based non–volatilde memory technology, *IEEE Aerospace Conf. Proc.*, 5 (Mar. 2001) 2289.*
Lai et al., OUM—a 180 nm nonvolatile memory cell element technology for stand alone and embedded applications, *IEDM Tech. Dig.*, (Dec. 2001) 36.5.1.*

* cited by examiner

Primary Examiner—Richard Elms
Assistant Examiner—Christian D. Wilson
(74) Attorney, Agent, or Firm—Trop, Pruner & Hu, P.C.

(57) ABSTRACT

A phase change memory may have reduced reverse bias current by providing a N-channel field effect transistor coupled between a bipolar transistor and a conductive line such a row line. By coupling the gate of the MOS transistor to the row line, reverse bias current in unselected cells or in the standby mode may be reduced.

18 Claims, 2 Drawing Sheets

|  | SELECTED COLUMN | UNSELECTED COLUMN | SELECTED ROW | UNSELECTED ROW |
|---|---|---|---|---|
| PROGRAM "1" | $V_{P1}$ | 0 | $V_{cc}$ | 0 |
| PROGRAM "0" | $V_{p0}$ | 0 | $V_{cc}$ | 0 |
| READ | $V_{read}$ | 0 | $V_{cc}$ | 0 |

ISOLATING PHASE CHANGE MATERIAL MEMORY CELLS

BACKGROUND

This invention relates generally to electronic memories and particularly to electronic memories that use phase change material.

Phase change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally any phase change material may be utilized. In some embodiments, however, thin-film chalcogenide alloy materials may be particularly suitable.

The phase change may be induced reversibly. Therefore, the memory may change from the amorphous to the crystalline state and may revert back to the amorphous state thereafter, or vice versa, in response to temperature changes. In effect, each memory cell may be thought of as a programmable resistor, which reversibly changes between higher and lower resistance states. The phase change may be induced by resistive heating.

In some embodiments, the cell may have a large number of states. That is, because each state may be distinguished by its resistance, a number of resistance determined states may be possible, allowing the storage of multiple bits of data in a single cell.

A variety of phase change alloys are known. Generally, chalcogenide alloys contain one or more elements from Column VI of the periodic table. One particularly suitable group of alloys is the GeSbTe alloys.

Existing phase change memories utilize bipolar transistors as isolation elements. The bipolar transistors are advantageous since they can provide relatively high programming current. Generally the bipolar transistor has its emitter tied to one terminal of the phase change memory element and its base tied to the respective row line while its collector is tied to a common substrate ground. The other terminal of the phase change memory element may be tied to its respective column. The bipolar transistor is conductive for programming or reading and is in the off state and possibly reverse biased for all other circumstances.

In particular, to program a one level, a selected column is brought to a voltage level equivalent to the one level programming voltage while unselected columns are brought to zero volts. The selected row is brought to zero volts and the unselected rows are both brought to the programming voltage or higher. Thus, when the column is brought high, the corresponding selected row has zero volts on it and as a result, current flows into the phase change memory cell.

Conversely, the unselected column has a zero volt bias and the unselected row has a programming voltage applied to it. All unselected memory elements thus have their emitter base either reverse biased or zero volt biased, assuring the bipolar transistors are turned off. All selected memory elements have their emitter base forward biased allowing appropriate current to flow through the phase change material.

One concern that arises with the bipolar isolation scheme is the large number of reverse biased emitter base junctions. All isolation elements except those on selected rows and columns see a reverse bias potential from emitter to base. A reverse bias leakage current must be supplied for each of these bits. For memory products with memory densities in the millions and billions, this reverse current leakage can represent a substantial current drain.

The leakage problem may be further aggravated in the standby mode. A designer may have all the arrays powered up in standby. The arrays are then ready for operation with little wake-up time delay. However, nearly all emitter base junctions of the isolation elements are reverse biased and thus substantial current can flow resulting in power dissipation in the standby mode. This is particularly undesirable for battery powered or power/energy sensitive applications.

Another alternative in the standby mode is to power down all blocks in the standby mode and then power up when the user wishes to read or write. A power up time delay is required due to the need to bias up all the blocks being accessed. Since all rows must be charged up to a voltage at least equal to the programming voltage or the read voltage, this may represent a significant capacitance in large memory arrays, resulting in a significant loss of time and large peak supply current required while awaiting power up.

Thus, it is evident there is a need for better ways to isolate memory cells in phase change memories.

DETAILED DESCRIPTION

Figures 1, 2:
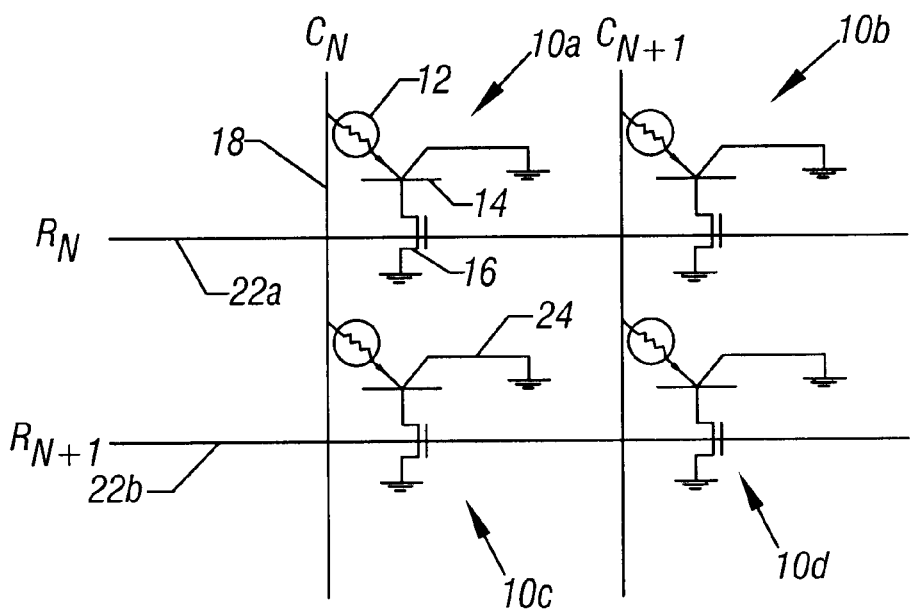
FIG. 1 is a schematic depiction of an array portion in accordance with one embodiment of the present invention.
FIG. 2 shows bias voltages in accordance with one embodiment of the present invention shown in FIG. 1.

Referring to FIG. 1, an array, including at least two row lines ($R_n$, $R_{n+1}$) and two column lines ($C_n$, $C_{n+1}$), has a plurality of cells 10. Each cell 10 includes a memory element 12 that includes a phase change material. One node of the phase change memory element 12 is coupled to the emitter of a bipolar transistor 14. The base of the bipolar transistor is coupled to the drain of an N-channel metal oxide semiconductor field effect transistor (MOSFET) 16.

The bipolar transistor 14 (which in one embodiment may be a PNP vertical bipolar transistor) includes a collector coupled to ground. The gate of each field effect rows transistor 16 may be coupled to a row line and the source of each field effect transistor 16 may be grounded. Thus, current flow through the phase change memory element 12 may be completely turned off, by applying zero volts to the gate of the N-channel field effect transistor 16.

The field effect transistor 16 may have little effect on programming or read current. However, when reducing the current drain through the cell 10 to the lowest possible extent, the transistor 16 may be turned off, greatly reducing the leakage current of the bipolar transistor 14. This may substantially reduce the overall current used by the memory array, improving battery performance in most cases.

Turning to FIG. 2, to program a level one into a selected memory cell 12, a programming voltage ($V_{p1}$) is applied to the selected column. The unselected column receives a zero volt bias. Similarly, the selected row receives the supply voltage ($V_{cc}$) while an unselected row receives zero volts. If the unselected row receives zero volts, then the transistor 16 is turned off, reducing leakage current through the bipolar transistor 14.

In contrast, in conventional phase change memory arrays, the selected row has zero volts applied and the unselected row has the programming voltage applied. This arrangement may result in significant leakage current.

Similarly, to program a zero level, the appropriate voltage level ($V_{po}$) is applied to the selected columns and the biasing is otherwise the same as described above. Likewise, to read a selected memory cell 12, the read voltage ($V_{read}$) is applied to the selected column and otherwise the bias levels are the same as was described above.

In accordance with one embodiment of the present invention, zero bias is seen across all isolation elements except those bits on a selected row or column. This may greatly reduce the required current to operate the array in some embodiments. Further, during standby, zero bias may be seen across all isolation elements for all bits in the array, greatly reducing product standby current in some embodiments.

Another advantage of some embodiments may be realized when coming out of the standby mode. In accordance with one embodiment of the present invention, the first programming or read operation out of standby can be done at the speed possible during standard operating mode. A single row may be brought high and N columns are also brought high. All of the other rows and columns can be left at zero volts. No pre-biasing of the array is needed prior to operation.

Another advantage of some embodiments of the present invention is the reduction of the row line current. The programming current for N cells may be supplied through N column lines. A single row line can be used for all N programmed cells since the row line does not have to sink all the base current from the N columns. In prior art approaches, all of the programming base current from all N cells is sunk through one row line or multiple blocks must be powered up. Large current through a single row line may result in electron migration issues. Row line voltage drops raise the required power supply voltage, and large row select pull down transistors take significant chip real estate area. Powering up multiple blocks has a disadvantage of higher operating power. Thus, some embodiments of the present invention may avoid or reduce all of these issues by steering the programming base current through the common source along multiple parallel source lines.

Figure 3:
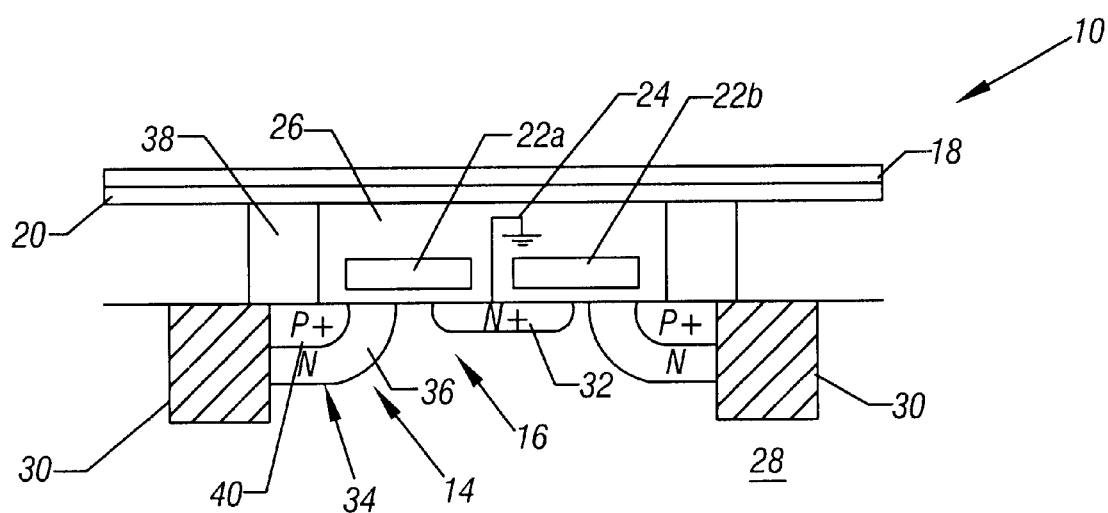
FIG. 3 is a greatly enlarged cross-section of a cell in accordance with one embodiment of the present invention.

Turning next to FIG. 3, a phase change memory cell 10 may include a column electrode 18 over a layer of phase change material 20. The phase change material 20 may be coupled to the substrate 28 through plugs or conductive vias 38. The vias 38 make contact to the emitter 40 of the bipolar transistor. The emitter 40 may be positioned over the base 36 which in turn is positioned over the substrate 28 which forms the bipolar collector 34.

The base 36 may also form the drain of the field effect transistor 16. The source 32 of the field effect transistor 16 may extend between a pair of opposed gates 22, each of which act as the gate of the field effect transistor 16 as well as the row line for the cell 10.

An active cell region is bounded by a partially encircling trench oxide 30. The trench oxide 30 partially encloses the cell while leaving an opening for the passage of the source 32. As indicated schematically at 24, the source 32 is grounded, in accordance with one embodiment of the present invention. Using vertical bipolar transistors may reduce the consumption of chip real estate. Isolation between emitters 40 may be achieved by a combination of shallow trench isolation and junction isolation in some embodiments.

Figure 4:
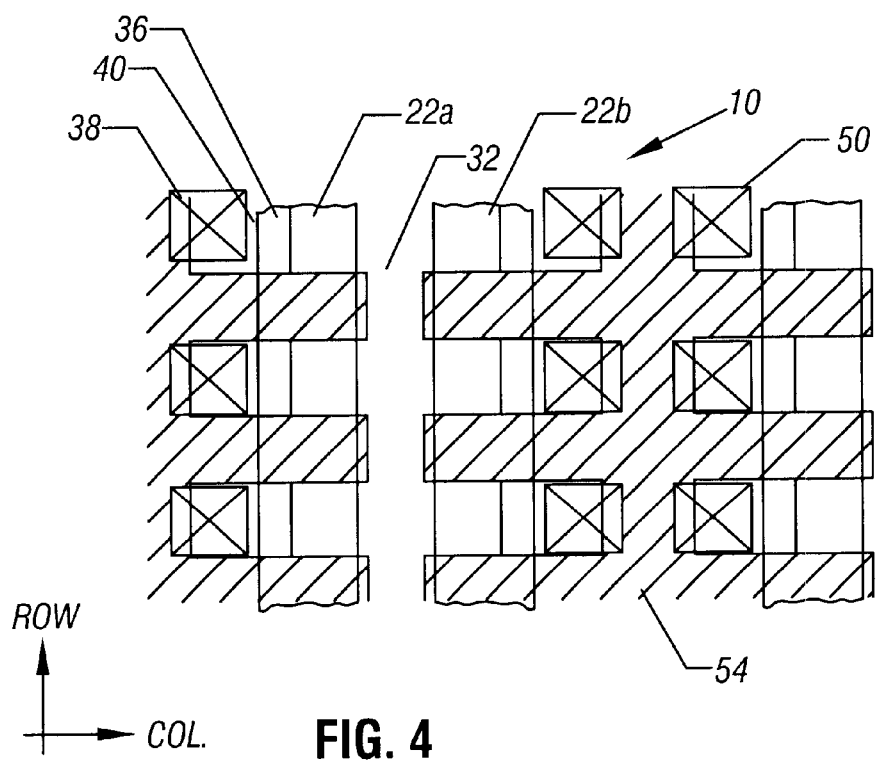
FIG. 4 is a top plan view of a portion of the array shown in FIG. 1 in accordance with one embodiment of the present invention.

Turning finally to FIG. 4, the common source 32 runs vertically along the page. Each cell 10 is defined by a plug or via 38 that makes contact to the emitter 40 of the bipolar transistor. Adjacent thereto is the base 36 of the bipolar transistor. The base 36 extends under the row line 22a. The base 36 may be introduced by ion implantation and diffused by subsequent thermal treatments.

Trench isolation 54, indicated by cross hatching, encircles each cell 10. Shallow trench isolation 54 may be utilized in one embodiment to separate every cell in the column direction and every other cell in the row direction.

The common source 32 may be run in the silicon active area with silicidation (such as $CoSi_2$ or $TiSi_2$) as an option occasionally tied down with ground metal lines running in the row direction. The row lines 22 (which may be formed of polysilicon) double as the gates of the MOS transistors 16 and run the full length of the array.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A memory comprising:
   a phase change memory element including a first and second node;
   a bipolar transistor coupled to said first node; and
   a N-channel field effect transistor coupled to said bipolar transistor.

2. The memory of claim 1 wherein said second node is coupled to a row or column line.

3. The memory of claim 1 wherein the gate of the field effect transistor is coupled to a row or column line.

4. The memory of claim 1 wherein the first node of the memory element is coupled to a column line and the gate of the field effect transistor is coupled to a row line.

5. The memory of claim 1 wherein the drain of the field effect transistor is coupled to the base of the bipolar transistor.

6. The memory of claim 5 wherein the collector of the bipolar transistor is grounded.

7. The memory of claim 1 including a pair of gates acting as row lines separated by a common source.

8. The memory of claim 1 wherein the base of the bipolar transistor acts as the drain of the field effect transistor.

9. The memory of claim 8 including a via that couples the phase change memory element to the emitter of the bipolar transistor.

10. The memory of claim 8 including a trench encircling the memory element, the bipolar transistor and the field effect transistor.

11. The memory of claim 10 including a passage through said trench for the source of said field effect transistor.

12. A memory comprising:
   a phase change memory element;
   a pair of conductive lines;
   a bipolar transistor coupled between the phase change memory element and at least one of said lines;
   a switch coupled between said bipolar transistor and one of said lines, said switch arranged to reduce the leakage current from said bipolar transistor.

13. The memory of claim 12 wherein said switch includes an N-channel metal oxide semiconductor field effect transistor.

14. The memory of claim 13 wherein the gate of the field effect transistor is coupled to a conductive line.

15. The memory of claim 12 wherein the drain of the field effect transistor is coupled to the base of the bipolar transistor.

16. The memory of claim 12 wherein the base of the bipolar transistor acts as the drain of the field effect transistor.

17. The memory of claim 12 wherein one of said lines acts as the gate of the field effect transistor.

18. The memory of claim 11 wherein said phase change memory element is coupled to a column line and the switch is coupled to a row line.

* * * * *